(12) United States Patent
Habu

(10) Patent No.: US 9,616,469 B2
(45) Date of Patent: Apr. 11, 2017

(54) LIGHT PROJECTION DEVICE

(71) Applicant: USHIO DENKI KABUSHIKI KAISHA, Tokyo (JP)

(72) Inventor: Tomoyuki Habu, Himeji (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/021,045

(22) PCT Filed: Sep. 9, 2014

(86) PCT No.: PCT/JP2014/073764
§ 371 (c)(1),
(2) Date: Mar. 10, 2016

(87) PCT Pub. No.: WO2015/037573
PCT Pub. Date: Mar. 19, 2015

(65) Prior Publication Data
US 2016/0221049 A1  Aug. 4, 2016

(30) Foreign Application Priority Data
Sep. 13, 2013  (JP) .................. 2013-189983

(51) Int. Cl.
*B08B 7/00* (2006.01)
*H01L 21/67* (2006.01)
*G03F 7/42* (2006.01)

(52) U.S. Cl.
CPC ........ *B08B 7/0057* (2013.01); *H01L 21/6719* (2013.01); *H01L 21/67115* (2013.01); *G03F 7/42* (2013.01)

(58) Field of Classification Search
None
See application file for complete search history.

(56) References Cited

U.S. PATENT DOCUMENTS 6,143,081 A * 11/2000 Shinriki ............... C23C 16/405
118/715
6,592,673 B2 * 7/2003 Welch ............... H01L 21/67259
118/668
(Continued)

FOREIGN PATENT DOCUMENTS

JP          02078224 A  *  3/1990
JP     H11-231554 A       8/1999
(Continued)

OTHER PUBLICATIONS

International Search Report—PCT/JP2014/073764 mailed Dec. 9, 2014.

*Primary Examiner* — Andrew Smyth
(74) *Attorney, Agent, or Firm* — Studebaker & Brackett PC

(57) ABSTRACT

A light irradiation device includes a workpiece support onto which a workpiece (object to be processed) is placed, an ultraviolet lamp for emitting a vacuum ultraviolet beam to a target surface (surface to be processed) of the workpiece, and a light transmitting window member disposed between the workpiece and the ultraviolet lamp and configured to pass the vacuum ultraviolet beam from the ultraviolet lamp therethrough. A gap defined between the target surface of the workpiece and the light transmitting window member is no greater than 1 mm. A gas supply unit is provided for supplying a processing gas into the gap such that the gas travels along the target surface in one direction. A gas blocking member is provided on the workpiece support in a region where the workpiece is not present. The region extends along a supply direction of the processing gas.

2 Claims, 3 Drawing Sheets

(56) References Cited

U.S. PATENT DOCUMENTS

| | | | |
|---|---|---|---|
| 6,719,849 B2* | 4/2004 | Oda | C23C 16/4581 |
| | | | 118/725 |
| 2001/0007645 A1* | 7/2001 | Honma | C23C 8/12 |
| | | | 422/186.09 |
| 2004/0023513 A1* | 2/2004 | Aoyama | C23C 16/452 |
| | | | 438/778 |

FOREIGN PATENT DOCUMENTS

| JP | 2948110 B2 | 9/1999 |
|---|---|---|
| JP | 2011-181535 A | 9/2011 |

* cited by examiner

LIGHT PROJECTION DEVICE

TECHNICAL FIELD

The present invention relates to a light projection or irradiation device. More specifically, the present invention pertains to a light irradiation device that is suitable for, for example, an optical (photo) ashing treatment to be applied to a resist used in a semiconductor element manufacturing process, a liquid crystal element manufacturing process or the like, for a removal treatment to be applied to a resist that adheres to a pattern surface of a template in a nanoimprinting device, for a dry cleaning treatment to be applied to a glass substrate of a liquid crystal device, a silicon wafer or the like, and for a removal treatment (desmearing treatment) to be applied to a smear created during a printed circuit board manufacturing process.

BACKGROUND ART

Currently, a dry cleaning process that uses an ultraviolet beam is known, for example, as a cleaning process used in the optical ashing treatment to be applied to a resist during a semiconductor element manufacturing process, a liquid crystal element manufacturing process or the like, a dry cleaning process used in the removal treatment to be applied to a resist that adheres to the pattern surface of the template of the nanoimprinting device, a dry cleaning treatment to be applied to a glass substrate of a liquid crystal element, a silicon wafer or the like, and a cleaning process used in a removal treatment (desmearing treatment) to be applied to a smear created during a printed circuit board manufacturing process. In particular, a dry cleaning process that uses ozone and reactive (radical) oxygen created with a vacuum ultraviolet beam emitted from an excimer lamp is often employed because it can finish a desired processing in a short time in an efficient manner. Different types of such light irradiation devices are proposed to date (see, for example, Patent Literature Documents 1 to 3).

One type of the light irradiation device that uses the vacuum ultraviolet beam is, for example, shown in FIG. 3. Beams from a plurality of ultraviolet lamps 41 that emit vacuum ultraviolet beams are directed, via a light transmitting window member 12, to a target surface (surface to be processed) Wa of a workpiece W placed in a processing gas atmosphere such as an oxygen gas atmosphere.

In this light irradiation device, the ultraviolet lamps 41 constitute a light source unit 40. The light source unit 40 has a casing 42 that has a box shape with an opening in one face thereof (lower surface in FIG. 3). A flat plate-like light transmitting window member 12 is disposed at the opening of the casing 42 to air tightly close the opening. In the casing 42, there are provided a plurality of rod-shaped ultraviolet lamps 41 such that the center axes of the lamps extend in parallel to each other in the same horizontal plane. A reflection mirror 43 is disposed to surround the ultraviolet lamps 41.

The workpiece W is placed on a workpiece placement surface (loading surface) 31a of a workpiece support (supporting table or stand) 31 of the light irradiation device. The workpiece placement surface 31a has a greater size than the target surface (surface to be processed) Wa of the workpiece W in the length direction and the breadth direction. The workpiece support 31 has a heating unit (not shown) for heating the workpiece W. The workpiece support 31 has a through hole 32a for supplying a gas, and another through hole 32a for discharging the gas. Each of the through holes 32a and 32b has an upper end that is open to the workpiece placement surface 31a. The through holes 32a and 32b are spaced from each other in the plane direction (the direction in which the lamps are arranged) such that the workpiece W is placed between the upper end of the through hole 32a and the upper end of the through hole 32b.

In the illustrated example, the reference numeral 34 designates one of two column-shaped spacer members that form a space having a predetermined volume between the light transmitting window member 12 and the workpiece support 31. A sealing member 35 is disposed on top of each spacer member 34. The light source unit 40 is air tightly disposed on the workpiece support 31 with the sealing members 35 therebetween. Thus, a processing chamber (treatment chamber) S is defined between the light source unit 40 and the workpiece support 31.

In FIG. 3, the gas flowing direction is indicated by arrows.

LISTING OF REFERENCES

Patent Literature Documents

PATENT LITERATURE DOCUMENT 1: Japanese Patent No. 2948110

PATENT LITERATURE DOCUMENT 2: Japanese Patent Application Laid-Open Publication No. 11-231554

PATENT LITERATURE DOCUMENT 3: Japanese Patent Application Laid-Open Publication No. 2011-181535

SUMMARY OF THE INVENTION

Problems to be Solved by the Invention

In order to improve the processing efficiency, the inventors supplied the processing gas into a gap between the target surface (surface to be processed) of the workpiece and the light transmitting window member (hereinafter referred to as "workpiece upper gap") such that the processing gas flowed in one direction along the target surface of the workpiece. Also, the inventors reduced the workpiece upper gap. Then, the inventors confirmed a problem that when the size of the workpiece upper gap, i.e., the distance between the workpiece and the light transmitting window member, was equal to or smaller than 1 mm, the processing was not conducted to the target surface of the workpiece at high uniformity.

The inventors assume that the reason for such problem is because a sufficient amount of the processing gas does not flow along the target surface of the workpiece as the distance between the workpiece and the light transmitting window member decreases.

Specifically, because the workpiece placement surface of the workpiece support has larger dimensions than the target surface of the workpiece in the length and breadth directions, the workpiece placement surface has a certain region in which the workpiece is not present (hereinafter occasionally referred to as "workpiece surrounding region"). When the workpiece is placed on the workpiece support, a gap (hereinafter occasionally referred to as "support upper gap") is left between the workpiece surrounding region and the light transmitting window member such that the gap surrounds the workpiece and the workpiece upper gap. The support upper gap has a larger dimension than the workpiece upper gap in the thickness direction of the workpiece W. Thus, the support upper gap possesses a larger conductance, and the processing gas is easy to flow in the support upper gap than in the workpiece upper gap. Accordingly, when the distance between the light transmitting window member and the workpiece is large (specifically, when the distance is greater than 1 mm), part of the processing gas that is supplied to the target surface of the workpiece (into the workpiece upper gap) in one direction does not flow generally linearly while the processing gas is flowing over the target surface of the workpiece. That part of the processing gas flows to the support upper gap that is defined next to the lateral face of the workpiece. However, because an amount of the processing gas that flows to the support upper gap is small, a sufficient amount of the processing gas which is required for the processing flows over the target surface of the workpiece. On the other hand, when the distance between the light transmitting window member and the workpiece is equal to or smaller than 1 mm, then the workpiece upper gap has an extremely small conductance and the processing gas is difficult to flow in the workpiece upper gap. Accordingly, an amount of the processing gas that flows from the target surface of the workpiece (workpiece upper gap) to the support upper gap defined on the lateral side of the workpiece increases. Thus, the inventors assume that a sufficient amount of the processing gas required for the processing does not flow over the target surface of the workpiece.

The inventors also confirmed that a similar problem occurred in a remarkable manner when the workpiece W had a large area. Specifically, it is the case when the breadth is equal to or greater than 510 mm, the length is equal to or greater than 515 mm, and the area of the target surface is equal to or greater than $2.6 \times 10^5$ mm$^2$.

The present invention is developed in view of the above-described problems, and an object of the present invention is to provide a light irradiation device that can process a workpiece (object to be processed) uniformly at a high processing efficiency.

Solution to the Problems

According to one aspect of the present invention, there is provided a light irradiation device that includes a workpiece support (table, stand) configured to support a workpiece (object to be processed) thereon, an ultraviolet lamp configured to irradiate a target surface of the workpiece with a vacuum ultraviolet beam, and a light transmitting window member disposed between the workpiece and the ultraviolet lamp and configured to transmit the vacuum ultraviolet beam, which is emitted from the ultraviolet lamp, therethrough. The gap (distance) between the target surface of the workpiece and the light transmitting window member is equal to or smaller than 1 mm. A gas feeding unit is provided for feeding the processing gas into the gap in one direction along the target surface. A gas shielding (blocking) member is provided on the workpiece support in a region in which the workpiece is not present. The region extends in the feeding direction of the processing gas.

In the light irradiation device of the present invention, it is preferred that the gas shielding member is in contact with the light transmitting window member. It is also preferred that that part of the gas shielding member which contacts the light transmitting window member is made from fluorocarbon resin.

Advantageous Effects of the Invention

Because the gas shielding member is provided in the light irradiation device of the present invention, the conductance on the target surface of the workpiece is greater than the conductance of the workpiece lateral face that extends in the feeding direction of the processing gas, i.e., the conductance of the lateral side of the workpiece. Thus, the processing gas that is fed to the target surface of the workpiece from the gas feeding unit and is caused to flow in a certain direction along the target surface of the workpiece is prevented or suppressed from flowing to the lateral side from above the target surface of the workpiece. Therefore, it is possible to cause a sufficient amount of the processing gas required for the processing to flow over the target surface of the workpiece. In addition, because the processing gas flows substantially linearly in one direction over the target surface of the workpiece, the flow speed distribution has high uniformity. The gap (distance) defined between the target surface of the workpiece and the light transmitting window member is equal to or less than 1 mm. Thus, the vacuum ultraviolet beam that arrives at the target surface of the workpiece has a sufficiently high intensity (sufficient quantity of light), and ozone and reactive oxygen are generated on the target surface of the workpiece in a stable manner. As a result, it is possible to process (treat) the workpiece uniformly at a high processing efficiency.

DESCRIPTION OF EMBODIMENTS

Embodiments of the present invention will now be described.

Figure 1:
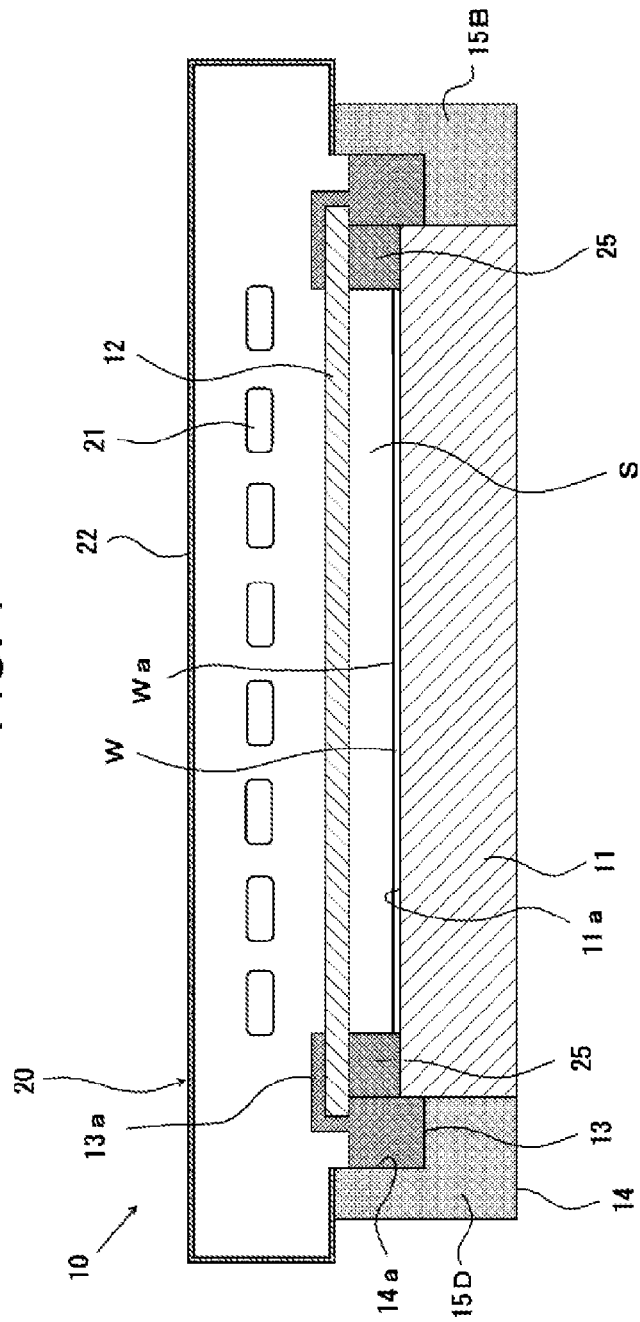
FIG. 1 is a cross-sectional view useful to describe an exemplary light irradiation device according to an embodiment of the present invention, and illustrates a cross-sectional view of the light irradiation device taken along a direction perpendicular to an axial direction of a luminous tube of an ultraviolet lamp of the light irradiation device.
Figure 2:
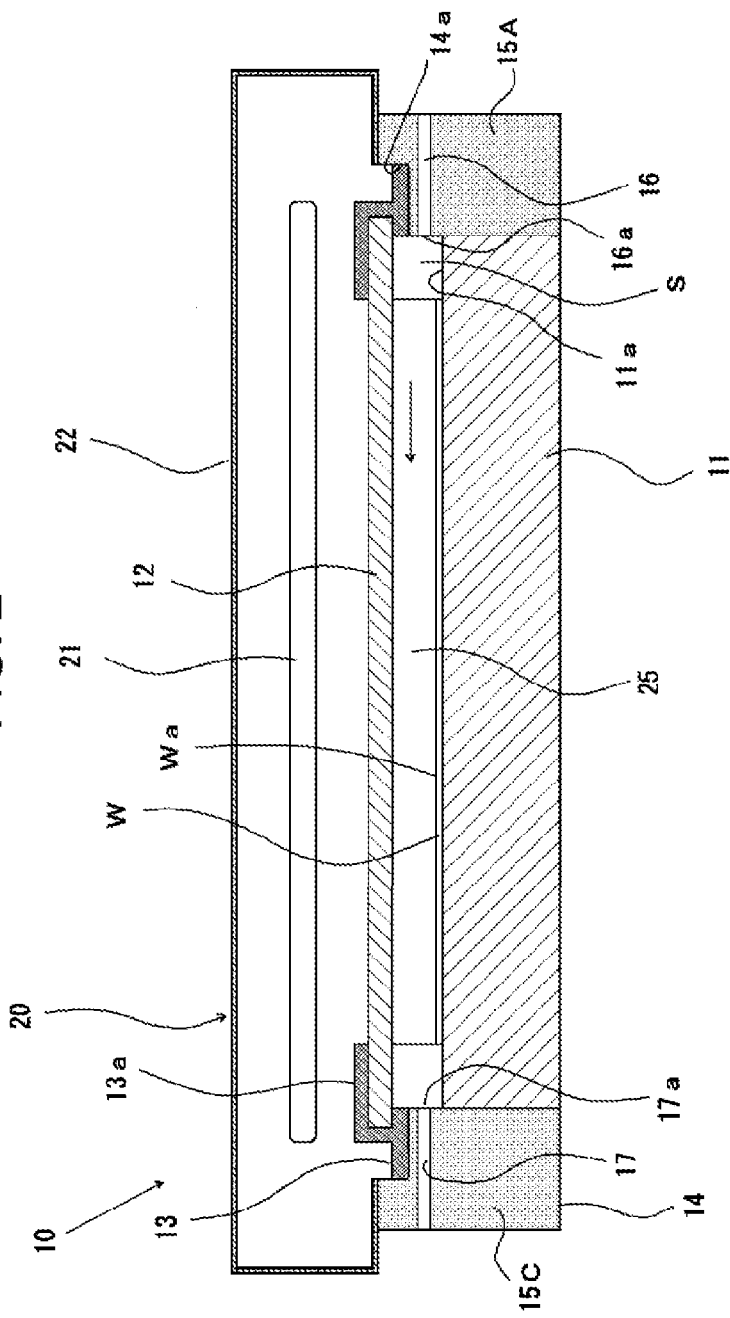
FIG. 2 is a cross-sectional view useful to describe the light irradiation device shown in FIG. 1, and illustrates a cross-sectional view of the light irradiation device taken along the axial direction of the luminous tube of the ultraviolet lamp.
Figure 3:
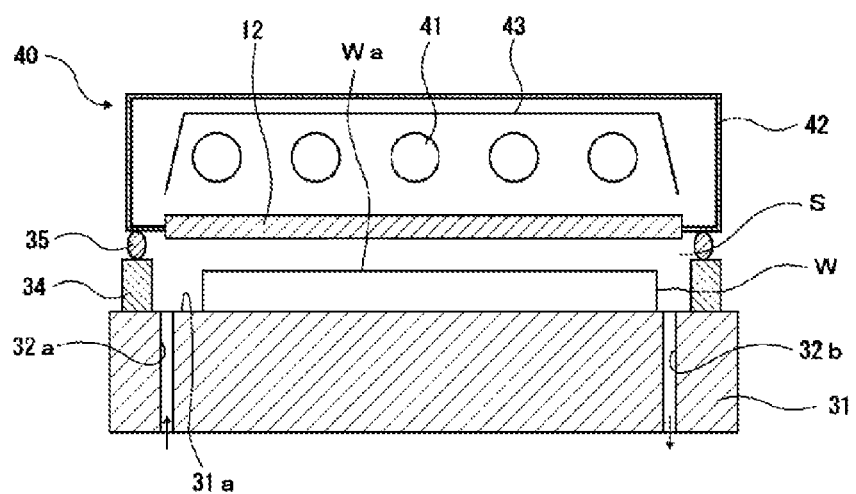
FIG. 3 is a cross-sectional view useful to describe an exemplary configuration of a conventional light irradiation device.

FIG. 1 is a cross-sectional view useful to describe an exemplary light irradiation device according to an embodiment of the present invention, and illustrates a cross-sectional view of the light irradiation device taken along a direction perpendicular to an axial direction of a luminous tube of an ultraviolet lamp of the light irradiation device. FIG. 2 is a cross-sectional view useful to describe the light irradiation device shown in FIG. 1, and illustrates a cross-sectional view of the light irradiation device taken along the axial direction of the luminous tube of the ultraviolet lamp.

The light irradiation device 10 includes a support device and a light source unit 20. The support device has a workpiece support (table or stand) 11 on which an object to be processed (i.e., workpiece) W is placed. The light source unit 20 is disposed above the workpiece support 11 as shown in FIGS. 1 and 2. The light source unit 20 has a plurality of ultraviolet lamps 21 (eight ultraviolet lamps in the illustrated embodiment). A light transmitting window member 12 is disposed between the ultraviolet lamps 21 and the workpiece W placed on a workpiece placement surface 11a of the workpiece support 11.

The workpiece support 11 of the light irradiation device 10 has a rectangular parallelepiped shape. The workpiece placement surface (workpiece loading surface) 11a is a flat surface, and has a larger size than a target surface (upper surface) Wa of the workpiece W in the length and breadth directions. The light transmitting window member 12 has a rectangular flat plate shape. The light transmitting window member 12 is supported by a rectangular supporting member 13 such that the light transmitting window member 12 extends in parallel to the workpiece placement surface 11a and faces the workpiece placement surface 11a. The supporting member 13 has a window member clamping portion 13a, and tightly clamps the outer periphery of the light transmitting window member 12 with the window member clamping portion 13a.

The light irradiation device 10 also includes a light source unit support 14. The light source unit support 14 has a rectangular shape and surrounds the lateral portions (lateral wall) of the workpiece support 11. The light source unit 20 is placed on an upper surface of the light source unit support 14. The light source unit support 14 has a space to receive the workpiece support 11 such that the workpiece support 11 can move (slide) in up and down directions (up and down directions in FIGS. 1 and 2). The light source unit support 14 also has a recess 14a that extends along the entire inner periphery of the light source unit support, and the recess 14a serves as the window member placement portion. As the supporting member 13 is arranged on the window member placement portion, a processing chamber S that has a predetermined thickness (height) is defined between the light transmitting window member 12 and the workpiece support 11. In other words, the processing chamber S is defined by the workpiece support 11, the light transmitting window member 12, the supporting member 13 and the light source unit support 14. In the processing chamber S, the center area of the workpiece placement surface 11a has a region in which the workpiece W is placed (hereinafter occasionally referred to as "workpiece placement region"). Around the workpiece placement region, defined is an annular region in which the workpiece W is not present (workpiece surrounding region). The entire workpiece placement region is irradiated with the vacuum ultraviolet beams from the ultraviolet lamps 21 via the light transmitting window member 12. The workpiece placement region defines a region in which the target surface Wa of the workpiece W is processed with the vacuum ultraviolet beams, ozone and the like (effective processing region).

In the illustrated embodiment, the workpiece W has a generally rectangular flat plate shape. The workpiece surrounding region on the workpiece placement surface 11a is not irradiated with the vacuum ultraviolet beams from the ultraviolet lamps 21 because the supporting member 13 shields the workpiece surrounding region from the vacuum ultraviolet beams. It should be noted that the window member clamping portion of the light irradiating device of this embodiment shown in FIGS. 1 and 2 may have a shorter dimension (the dimension in the width direction in FIGS. 1 and 2 may be reduced), and not only the workpiece placement region (effective processing region) on the workpiece placement surface of the workpiece support but also the workpiece surrounding region may be irradiated with the vacuum ultraviolet beams from the ultraviolet lamps.

The support device has a drive mechanism to move the workpiece support 11 in upward and downward directions. As the workpiece support 11 is caused to move up and down by the drive mechanism, the gap (workpiece upper gap) defined between the target surface Wa of the workpiece W and the light transmitting window member 12, i.e., the distance between the workpiece W and the light transmitting window member 12, is adjusted. Specifically, the light irradiation device 10 can change the workpiece upper gap to a desired value without relying on the thickness of the workpiece W.

In the light irradiation device 10, the target surface Wa of the workpiece W in the workpiece placement region inside the processing chamber S faces the light transmitting window member 12. The height of the workpiece upper gap (distance between the workpiece W and the light transmitting member 12) is equal to or smaller than 1 mm, preferably 0.1 mm to 1.0 mm, more preferably 0.1 mm to 0.5 mm, and particularly preferably 0.3 mm to 0.5 mm.

When the height of the workpiece upper gap is equal to or smaller than 1 mm, it is possible to stably generate ozone and reactive oxygen. It is also possible to allow the vacuum ultraviolet beams that arrive at the target surface Wa of the workpiece W to have a sufficiently strong intensity (sufficient quantity of light).

The light source unit 20 includes a casing 22 that has an opening in its one face (lower face in FIGS. 1 and 2). The casing 22 has a box-like shape or a generally rectangular parallelepiped shape. In the casing 22, disposed are a plurality of rod-shaped ultraviolet lamps 21. The ultraviolet lamps 21 are arranged at predetermined intervals (at the fixed intervals in FIG. 1) such that the center axes of the ultraviolet lamps 21 extend in parallel to each other in the same horizontal plane.

The light source unit 20 is placed on top of the light source unit support 14. Thus, the opening of the casing 22 is closed by the light transmitting window member 12, the light source unit support 14, the support member 13 and the workpiece support 11. Accordingly, a closed lamp chamber is defined in the casing 22. The ultraviolet lamps 21 face the target surface Wa of the workpiece W via the light transmitting window member 12.

The ultraviolet lamps 21 may be any suitable lamps, which are known in the art, as long as the lamps can emit vacuum ultraviolet beams. For example, the ultraviolet lamps 21 may be low pressure mercury lamps that emit vacuum ultraviolet beams at a wavelength of 185 nm, xenon excimer lamps that emit vacuum ultraviolet beams at a dominant wavelength of 172 nm, or fluorescent excimer lamps that have xenon gas sealed in luminous tubes and fluorescent materials applied on inner surfaces of the luminous tubes to emit vacuum ultraviolet beams at a wavelength of, for example, 190 nm.

In the illustrated embodiment, the ultraviolet lamps 21 are square excimer lamps that emit light in a particular direction (downward direction in FIGS. 1 and 2).

The light irradiation device 10 also includes a gas feeding unit to feed the processing gas into the processing chamber S. The gas feeding unit can feed the processing gas over the target surface Wa of the workpiece W, i.e., it can feed the processing gas into the workpiece upper gap that has a generally rectangular shape, such that the processing gas flows in one direction (to the left in FIG. 2) along the target surface Wa of the workpiece W. In other words, the gas feeding unit supplies the processing gas such that the processing gas flows generally linearly in one direction at least over the target surface Wa of the workpiece W (in the workpiece upper gap).

The gas feeding unit includes a through hole 16 for gas feeding, which is formed in the side portion 15A of the light source unit support 14, a through hole 17 for gas discharging, which is formed in the opposite side portion 15C, and a processing gas supply source (not shown), which is connected to the gas feeding through hole 16. The gas feeding through hole 16 has an opening 16a for the gas feeding. The opening 16a is open to the workpiece upper gap in that inner wall of the side portion 15A which is exposed to the interior of the processing chamber S. The opening 16a is elongated in the lateral direction, i.e., in the same direction as the side portion 15A extends (in the direction perpendicular to the drawing sheet of FIG. 2). The gas discharging through hole 17 has an opening 17a for the gas discharging. The opening 17a is open to the workpiece upper gap in that inner wall of the side portion 15C which is exposed to the interior of the processing chamber S. The opening 17a is elongated in the lateral direction, i.e., in the same direction as the side portion 15C extends (in the direction perpendicular to the drawing sheet of FIG. 2). Thus, the opening 17a for the gas discharging faces the opening 16a for the gas feeding.

It should be noted that any of the openings 16a and 17a may be a single slit that is elongated in the lateral direction, or may include a plurality of slits.

In the illustrated embodiment, each of the openings 16a and 17a is a slit that is elongated in the lateral direction and extends in the inner wall of each of the side portions 15A and 15C such that each of the openings 16a and 17a faces the entire workpiece upper gap in the lateral direction.

In FIG. 2, the feeding direction of the processing gas relative to the target surface Wa of the workpiece W (workpiece upper gap), i.e., the flowing direction of the processing gas over the target surface Wa of the workpiece W, is indicated by the arrow.

The processing gas to be supplied into the processing chamber S from the gas feeding unit contains oxygen gas at a predetermined concentration.

For example, the processing gas may be an oxygen gas, or a mixture of oxygen gas and ozone gas.

Preferably, the oxygen concentration in the processing gas is equal to or greater than 70 volume %.

When the oxygen gas concentration in the processing gas has a value in the above-mentioned range, it is possible to increase an amount of ozone and reactive oxygen, which are generated upon irradiation with the vacuum ultraviolet beams. Thus, it is possible to carry out the processing in a desired and reliable manner.

Conditions for the gas feeding by the gas feeding unit may appropriately be decided on the basis of the size of the target surface Wa of the workpiece W and other factors in view of the type of the workpiece W, the type of the processing to be applied to the target surface Wa, the type of the processing gas, the composition of the processing gas, and the like. For example, when the breadth dimension of the target surface Wa is equal to or greater than 510 mm, the length dimension is equal to or greater than 515 mm, and the target surface area is equal to or greater than $2.6 \times 10^5$ mm$^2$, then the gas flow rate is preferably 0.01 LPM to 2 LPM, and the gas flow speed is preferably 1 mm/sec to 50 mm/sec.

The light irradiation device 10 includes the gas shielding (blocking) members 25 and 25 in the processing chamber S. Each of the gas shielding members 25 and 25 extends in the feeding direction of the processing gas. Each of the gas shielding members 25 and 25 is present in that region on the workpiece support 11 in which the workpiece W is not present. In other words, the gas shielding members 25 and 25 are disposed in the workpiece surrounding region on the workpiece placement surface 11a of the workpiece support 11 and extend along the workpiece W (workpiece placement region) in the processing gas feeding direction.

The gas shielding members 25 and 25 have the shapes that can reduce the conductance of those gaps which are defined next to the opposite lateral ends of the workpiece upper gap, as compared to the conductance of the workpiece upper gap. Thus, the gas shielding members 25 and 25 have a gas shielding function to suppress or prevent the processing gas from flowing in the direction other than the gas feeding direction over the target surface Wa of the workpiece W (in the workpiece upper gap).

The details of the gas shielding members 25 and 25 will be described. Each of the gas shielding members 25 and 25 has a rectangular parallelepiped shape. One of the gas shielding members 25 and 25 is disposed on the workpiece placement surface 11a in a region between the workpiece W and the side portion 15B of the light source unit support 14 and extends along the workpiece W. The other gas shielding member 25 is disposed on the workpiece placement surface 11a in a region between the workpiece W and the side portion 15D of the light source unit support 14 and extends along the workpiece W. The height of each gas shielding member 25 (vertical dimension in FIG. 1) is equal to or smaller than the distance between the workpiece support 11 and the light transmitting window member 12, and is greater than the thickness of the workpiece W. Thus, the upper ends of the gas shielding members 25 and 25 (upper ends of the gas shielding members in FIG. 1) are positioned outside the edges of the workpiece upper gap in the feeding direction of the processing gas. One side face of each gas shielding member 25 contacts the corresponding side face of the workpiece W (specifically, that side face which is opposite the side portion 15B, or that side face which is opposite the side portion 15D) and the corresponding edge of the workpiece upper gap (specifically, that edge which is opposite the side portion 15B, or that edge which is opposite the side portion 15D).

In this illustrated embodiment, the gas shielding members 25 and 25 are replaceable. Because the gas shielding members 25 and 25 are replaceable, it is possible to use the gas shielding members 25 and 25 having an appropriate or desired size depending upon the dimensions of the workpiece W (e.g., length, breadth and thickness of the workpiece) and the light irradiation conditions (e.g., the distance between the workpiece W and the ultraviolet lamps 21). It is also possible to adjust the positions of the gas shielding members 25 and 25. Accordingly, the light irradiation device 10 can process a plurality of types of workpiece W which may have different dimensions under different light irradiation conditions.

As shown in FIGS. 1 and 2, it is preferred that the entire length of each gas shielding member 25 is equal to the dimension of the workpiece W in the processing gas feeding direction in view of the gas shielding function, and the height of each gas shielding member 25 is equal to the distance between the workpiece support 11 and the light transmitting window member 12. When the gas shielding members 25 and 25 have such shape respectively, it is possible for the gas shielding members to prevent the processing gas, which is supplied over the target surface Wa (into the workpiece upper gap), from flowing into lateral gaps next to the workpiece W.

In the illustrated embodiment, the gas shielding members 25 and 25 have a shape that can occlude (fill up) the generally rectangular parallelepiped space (gap) defined between the workpiece upper gap and the side portions 15B and 15D of the light source unit support 14. Specifically, each gas shielding member 25 has a rectangular parallelepiped shape, with the entire length of each gas shielding member 25 being equal to the dimension of the workpiece W in the processing gas feeding direction, and the height of each gas shielding member 25 being equal to the distance between the workpiece support 11 and the light transmitting window member 12.

The gas shielding members 25 and 25 are made from a material that is resistant to the vacuum ultraviolet beam and is also resistant to the ozone.

As illustrated in FIG. 1, when the gas shielding members 25 and 25 are in contact with the light transmitting window member 12, it is preferred that those portions of the gas shielding members 25 and 25 which contact the light transmitting window member 12 (hereinafter occasionally referred to as "window contacting portions") are made from fluorocarbon resin. The gas shielding members 25 and 25 that have the window contacting portions made from the fluorocarbon resin may entirely be made from the fluorocarbon resin, or may have a base body made from a material other than the fluorocarbon resin, with a fluorocarbon resin layer being formed over the base body.

Because the window contacting portions of the gas shielding members 25 and 25 are made from the fluorocarbon resin, it is possible to prevent harmful effects such as breakage of the light transmitting window member 12, which would otherwise occur when the gas shielding members 25 and 25 contact the light transmitting window member 12.

Other than the fluorocarbon resin, the material of the gas shielding members 25 and 25 may be a stainless steel.

In the illustrated embodiment, each of the gas shielding members 25 and 25 has a base body, which is made from a stainless steel, and a fluorocarbon resin layer is laminated over an entire upper surface of the base body.

The material of the light transmitting window member 12 may be any suitable material as long as it has transmissivity (permeability) to the vacuum ultraviolet beams emitted from the ultraviolet lamps 21 and is resistant to the vacuum ultraviolet beams and ozone. For example, the material of the light transmitting window member 12 is silica glass (quartz glass).

Preferably, the light irradiation device 10 includes a heating unit (not shown) to heat the workpiece W, and the heating unit is associated with (connected to or embedded in) the workpiece support 11.

When the light irradiation device has such configuration, it is possible to facilitate (enhance) the functions of the ozone and the reactive oxygen as the temperature of the target surface Wa of the workpiece W rises. Thus, the processing takes place efficiently.

Because the length and breadth dimensions of the workpiece placement surface 11a of the workpiece support 11 are greater than the length and breadth dimensions of the target surface Wa of the workpiece W, it is possible to uniformly heat the target surface Wa of the workpiece W.

The conditions of the heating by the heating unit include, for example, that the temperature of the workpiece placement surface 11a becomes 100 degrees C. to 150 degrees C.

When the light irradiation device 10 has such configuration, the target surface Wa of the workpiece W, which is placed in the atmosphere of the processing gas, is irradiated with the light including the vacuum ultraviolet beams emitted from the ultraviolet lamps 21 via the light transmitting window member 12 such that the surface processing (treatment) is carried out to the workpiece W.

Specifically, the processing gas is supplied into the processing chamber S, in which the workpiece W and the gas shielding members 25 and 25 are disposed, through the gas feed opening 16a under the predetermined gas feed conditions. In this manner, the processing gas is continuously supplied into the processing chamber S such that the processing chamber S is filled with the processing gas (the processing chamber becomes the processing gas atmosphere). Then, all the ultraviolet lamps 21 of the light source unit 20 are turned on such that the vacuum ultraviolet beams from the ultraviolet lamps 21 are directed to the target surface Wa of the workpiece W via the light transmitting window member 12. Thus, the target surface Wa of the workpiece W is processed (treated) with the vacuum ultraviolet beams that arrive at the target surface Wa of the workpiece W, together with the ozone and reactive oxygen that are generated by the vacuum ultraviolet beams. In the processing chamber S, the processing gas supplied from the gas feed opening 16a mixes with reaction gases (e.g., carbon dioxide gas) generated upon the processing of the target surface Wa (gases generated upon reactions) while the processing gas is flowing through the processing chamber S. The mixture of the processing gas with the reaction gases (hereinafter occasionally referred to as "exhaust gas") is discharged out of the processing chamber S through the gas discharge opening 17b.

The light irradiation device 10 includes the gas shielding members 25 and 25 inside the processing chamber S, and the gas shielding members 25 and 25 occupy (occlude) those opposite lateral spaces of the workpiece upper gap which extend in the feeding direction of the processing gas. In the processing chamber S, therefore, the flowing passage (flowing space) of the processing gas is formed between a generally rectangular gap, which extends along the side portion 15A and is defined between the side portion 15A and the workpiece W, the workpiece upper gap, and a generally rectangular gap, which extends along the side portion 15C and is defined between the side portion 15C and the workpiece W. Accordingly, the entire processing gas supplied from the gas feed opening 16a flows over the target surface Wa of the workpiece W (in the workpiece upper gap) generally linearly toward the gas exit opening 17a from the gas inlet opening 16a. As a result, it is possible to obtain high uniformity in the flow speed distribution across the target surface Wa of the workpiece W. Thus, it is possible to feed a sufficient amount of the processing gas, which is required for the processing, over the target surface Wa of the workpiece W (into the workpiece upper gap) at a desired flow velocity as the gas feeding conditions are adjusted by the gas feeding unit. Furthermore, because the height of the workpiece upper gap is equal to or smaller than 1 mm, the vacuum ultraviolet beams that reach the target surface Wa of the workpiece W have a sufficiently high intensity (sufficient quantity of light), and the ozone and reactive oxygen are stably generated on the target surface Wa (in the workpiece upper gap). As a result, it is possible to uniformly process (treat) the workpiece W at a high processing efficiency.

For example, the light irradiation device 10 is preferably used for an optical asking treatment to be applied to a resist used in a semiconductor element manufacturing process, a liquid crystal element manufacturing process or the like, for a removal treatment to be applied to a resist that adheres to a pattern surface of a template in a nanoimprinting device, for a dry cleaning treatment to be applied to a glass substrate of a liquid crystal element, a silicon wafer or the like, and for a removal treatment (desmearing treatment) to be applied to a smear created during a printed circuit board manufacturing process.

The light irradiation device of the present invention is not limited to the above-described embodiment. Various changes and modifications may be made to the above-described embodiment.

For example, the shape of the gas shielding members is not limited to the one shown in FIGS. 1 and 2. Specifically, the gas shielding members may have any suitable shape as long as the gas shielding members extend on the workpiece support in the processing gas feed direction, are disposed in those regions in which the workpiece is not present, and demonstrate the predetermined gas shielding function. For example, the entire length of each gas shielding member shown in FIG. 1 may become greater than the dimension of the workpiece in the processing gas feed direction, and the opposite end faces of each gas shielding member may protrude outward from the lateral faces of the workpiece (i.e., those faces of the workpiece which extend in a direction perpendicular to the processing gas feeding direction).

If the gas shielding members of the light irradiation device have such configuration, the protruding portions of the gas shielding members serve as gas guiding elements. Thus, it is possible to cause the processing gas, which is supplied from the gas feed opening, to efficiently flow toward over the target surface of the workpiece (toward the workpiece upper gap). In addition, it is possible to cause the exhaust gas to efficiently flow toward the gas exit opening, and to smoothly exit from the gas exit opening. Thus, it is possible to efficiently remove from the processing chamber the reaction products which would otherwise exert adverse influences on the processing of the target surface of the workpiece. As a result, an even higher processing efficiency is achieved.

Although the workpiece support of the light irradiation device shown in FIGS. 1 and 2 move up and down, the workpiece support may not move up and down as long as the height of the workpiece upper gap is equal to or smaller than 1 mm.

The gas feeding unit may be any suitable unit as long as the gas feeding unit can feed the processing gas to (or over) the processing surface of the workpiece such that the processing gas flows in one direction along the processing surface of the workpiece. For example, the gas feeding unit of the light irradiation device shown in FIGS. 1 and 2 may be configured such that the gas feed opening is open in a region on the workpiece placement surface between the side portion 15A and the workpiece, and the gas discharge opening is open in a region on the workpiece placement surface between the side portion 15C and the workpiece.

REFERENCE NUMERALS AND SYMBOLS

10: Light irradiation device
11: Workpiece support
11a: Workpiece placement surface
12: Light transmitting window member
13: Supporting member
13a: Window member clamping portion
14: Light source unit support
14a: Recess
15A, 15B, 15C, 15D: Side portions
16: Through hole for gas feeding
16a: Opening for gas feeding
17: Through hole for gas discharging
17a: Opening for gas discharging
20: Light source unit
21: Ultraviolet lamp
22: Casing
25: Gas shielding member
31: Workpiece support
31a: Workpiece placement surface
32a: Through hole for gas feeding
32b: Through hole for gas discharging
34: Spacer member
35: Sealing member
40: Light source unit
41: Ultraviolet lamp
42: Casing
43: Reflection mirror
W: Workpiece, or object to be processed
Wa: Target surface, or surface to be processed

The invention claimed is:

1. A light irradiation device comprising:
a workpiece support configured to support a workpiece thereon;
an ultraviolet lamp configured to irradiate a target surface of the workpiece with a vacuum ultraviolet beam;
a light transmitting window member disposed between the workpiece and the ultraviolet lamp, and configured to transmit the vacuum ultraviolet beam, which is emitted from the ultraviolet lamp, therethrough, with a gap defined between the target surface of the workpiece and the light transmitting window member being equal to or smaller than 1 mm;
a gas feeding unit configured to feed a processing gas into the gap in one direction along the target surface; and
a gas shielding member disposed on the workpiece support in a region in which the workpiece is not present, the gas shielding member extending in a feeding direction of the processing gas and being arranged such that a side face of the gas shielding member in a longitudinal direction contacts a side face of the workpiece supported by the workpiece support with respect to the feeding direction of the processing gas, and
a height of the gas shielding member being equal to a distance between the workpiece support and the light transmitting window member.

2. The light irradiation device according to claim 1, wherein the gas shielding member contacts the light transmitting window member, and that part of the gas shielding member which contacts the light transmitting window member is made from fluorocarbon resin.

* * * * *